United States Patent
Wu et al.

(10) Patent No.: US 11,056,663 B2
(45) Date of Patent: Jul. 6, 2021

(54) ELECTROLUMINESCENT DEVICE HAVING COLOR LAYERS IN PATTERNED PIXEL DEFINE LAYER

(71) Applicant: Au Optronics Corporation, Hsinchu (TW)

(72) Inventors: Hsin-Hui Wu, New Taipei (TW); Kuan-Heng Lin, Kaohsiung (TW); Meng-Ting Lee, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 103 days.

(21) Appl. No.: 16/407,198

(22) Filed: May 9, 2019

(65) Prior Publication Data

US 2019/0355920 A1 Nov. 21, 2019

(30) Foreign Application Priority Data

May 17, 2018 (TW) .................................. 107116840

(51) Int. Cl.
  *H01L 51/50* (2006.01)
  *H01L 27/32* (2006.01)
  *H01L 51/56* (2006.01)

(52) U.S. Cl.
  CPC ........ *H01L 51/504* (2013.01); *H01L 27/3246* (2013.01); *H01L 51/56* (2013.01); *H01L 2227/323* (2013.01); *H01L 2251/556* (2013.01)

(58) Field of Classification Search
  CPC ............... H01L 51/504; H01L 27/3246; H01L 2227/323; H01L 2251/556
  See application file for complete search history.

(56) References Cited

U.S. PATENT DOCUMENTS

| 2015/0060825 A1* | 3/2015 | Song ................... H01L 51/5278 |
| | | 257/40 |
| 2017/0155070 A1* | 6/2017 | Han ..................... H01L 27/3209 |
| 2019/0172876 A1* | 6/2019 | Xia ...................... H01L 51/5206 |

FOREIGN PATENT DOCUMENTS

| CN | 106601919 | 4/2017 |
| CN | 107068718 | 8/2017 |

* cited by examiner

Primary Examiner — Michael Jung
(74) Attorney, Agent, or Firm — JCIPRNET

(57) ABSTRACT

An electroluminescent device includes a substrate, a first electrode, a patterned pixel define layer, a first color layer, a first connection layer, a second color layer, and a second electrode. The patterned pixel define layer has a first opening. A projected area of the first opening on the substrate is A. The first color layer is located in the first opening and electrically connected to the first electrode. A projected area of the first connection layer on the substrate is B. The second color layer is located between the first connection layer and the second electrode. When a ratio of B to A is r1, light emitted by the electroluminescent device has a first color temperature. When the ratio of B to A is r2, the light emitted by the electroluminescent device has a second color temperature.

17 Claims, 16 Drawing Sheets

ELECTROLUMINESCENT DEVICE HAVING COLOR LAYERS IN PATTERNED PIXEL DEFINE LAYER

CROSS-REFERENCE TO RELATED APPLICATION

This application claims the priority benefit of Taiwan application serial no. 107116840, filed on May 17, 2018. The entirety of the above-mentioned patent application is hereby incorporated by reference herein and made a part of this specification.

BACKGROUND OF THE INVENTION

Field of the Invention

The invention relates to an electroluminescent device, and particularly relates to an electroluminescent device including at least two color layers and a manufacturing method thereof.

Description of Related Art

When current passes through an electroluminescent device, electrons and holes will recombine in a color layer to generate excitons, and light in different wavelengths will be emitted according to a material characteristic of the color layer.

In the prior art, the electroluminescent device capable of emitting white light is to achieve the purpose of emitting the white light by cooperation of a red color layer, a green color layer, and a blue color layer. More specifically, the electroluminescent device capable of emitting the white light can be formed by overlapping a light-emitting unit having the red color layer, a light-emitting unit having the green color layer, and a light-emitting unit having the blue color layer with each other. However, it is known that the electroluminescent device capable of emitting the white light controls a color temperature (or called as a correlated color temperature (CCT)) of the light emitted by the electroluminescent device by an optical design inside the device with material selection and electrical adjustment or by independently controlling luminous intensity ratios of different light-emitting units by a circuit outside the device. In the electroluminescent device of which the color temperature is adjusted by the aforementioned method inside the device, it is necessary to correspond different device structures and processes (including a number of processes, a type of material, etc.) under different color temperature requirements. These adjustments not only inevitably affect the luminous efficiency of the devices directly, but also waste production time during a conversion process. Besides, although the structure of the device is not affected in the electroluminescent device of which the color temperature is adjusted by the aforementioned method outside the device, the longitudinal circuit design of the device needs to be additionally added, thereby increasing the difficulty and complexity of the circuit design. Therefore, there is an urgent need for a solution to the aforementioned problem.

SUMMARY OF THE INVENTION

The invention provides a method of manufacturing an electroluminescent device that the light emitted by the electroluminescent device may have a desired color temperature by adjusting an area of a first light-emitting region and an area of a second light-emitting region.

The invention provides an electroluminescent device that the light emitted by the electroluminescent device may have a desired color temperature by adjusting an area of a first light-emitting region and an area of a second light-emitting region.

According to at least one embodiment of the invention, a method of manufacturing the electroluminescent device includes the following steps. A first electrode is formed on a substrate. A patterned pixel define layer is formed on the substrate. The patterned pixel define layer has a first opening. A projected area of the first opening on the substrate is A, so as to define an area of a first light-emitting region. A first color layer is formed in the first opening. The first color layer is electrically connected to the first electrode. A first connection layer is formed on the first color layer. A projected area of the first connection layer on the substrate is B, so as to define an area of a second light-emitting region. A second color layer is formed on the first connection layer. The first connection layer is located between the first color layer and the second color layer. The second electrode is formed on the second color layer. When a ratio of B to A is r1, light emitted by the electroluminescent device has a first color temperature. When the ratio of B to A is r2, the light emitted by the electroluminescent device has a second color temperature. r1 is different from r2, and the first color temperature is different from the second color temperature.

According to at least one embodiment of the invention, an electroluminescent device includes a substrate, a first electrode, a patterned pixel define layer, a first color layer, a first connection layer, a second color layer, and a second electrode. The first electrode is located on the substrate. The patterned pixel define layer is located on the substrate. The patterned pixel define layer has a first opening. A projected area of the first opening on the substrate is A, so as to define an area of a first light-emitting region. The first color layer is located in the first opening and electrically connected to the first electrode. The first connection layer is located on the first color layer. A projected area of the first connection layer on the substrate is B, so as to define an area of a second light-emitting region. The first connection layer is located between the first color layer and the second color layer. The second color layer is located between the first connection layer and the second electrode. When a ratio of B to A is r1, light emitted by the electroluminescent device has a first color temperature. When the ratio of B to A is r2, the light emitted by the electroluminescent device has a second color temperature. r1 is different from r2, and the first color temperature is different from the second color temperature.

One of the purposes of the invention is to reduce the difficulty of process of the electroluminescent device.

One of the purposes of the invention is to reduce the effect of adjusting the color temperature of the electroluminescent device on the luminous efficiency thereof.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
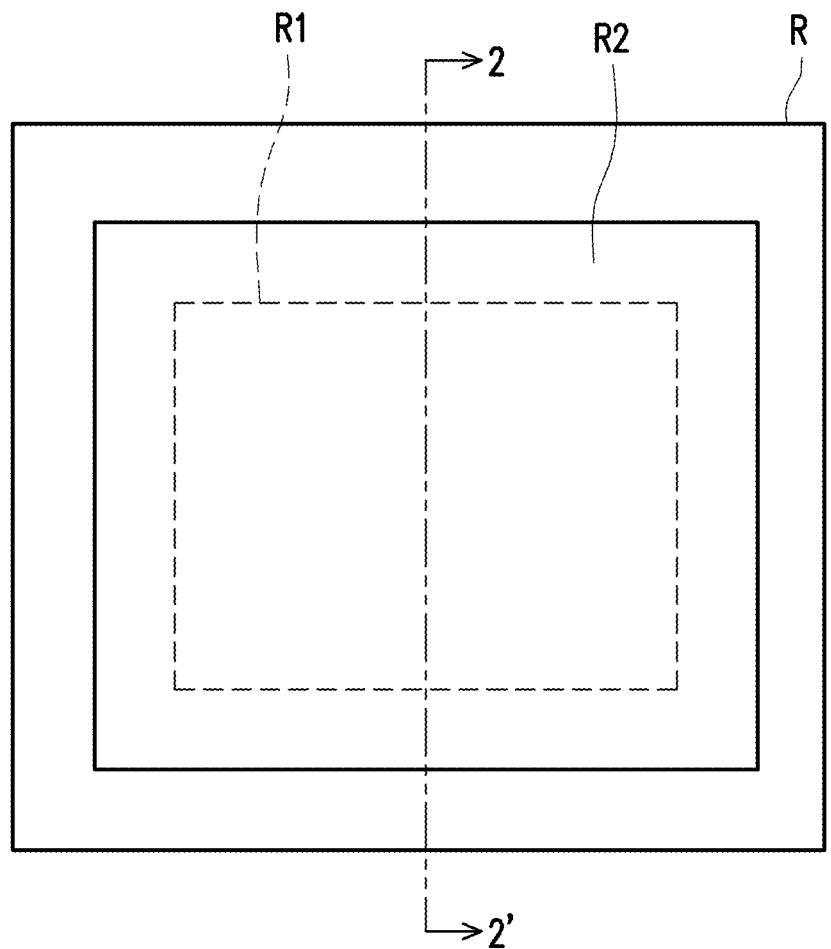
FIG. 1 is a schematic top view of an electroluminescent device according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic top view of an electroluminescent device according to a first embodiment of the invention. FIG. 2A to FIG. 2F are schematic cross-sectional views of a manufacturing method of the electroluminescent device of FIG. 1 along a section line 2-2'.

Figure 2A:
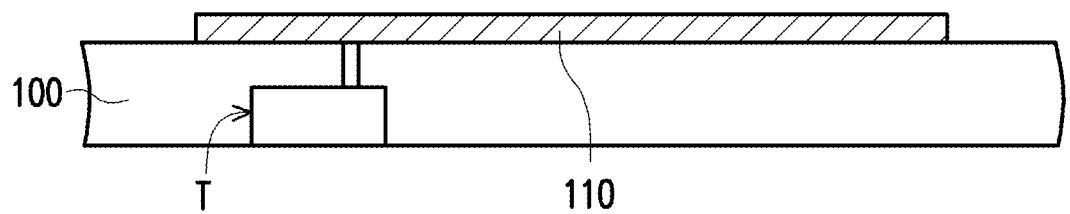
FIG. 2A to FIG. 2F are schematic cross-sectional views of a manufacturing method of the electroluminescent device of FIG. 1 along a section line 2-2'.

Referring to FIG. 2A, a first electrode 110 is formed on a substrate 100. A scan line (not shown), a data line (not shown), and a switch device T have been disposed in the substrate 100, for example. The switch device T is electrically connected to the scan line, the data line, and the first electrode 110, for example. In some embodiments, there may be other active devices or passive devices setting between the switch device T and the first electrode 110, but the invention is not limited thereto.

Figure 2B:
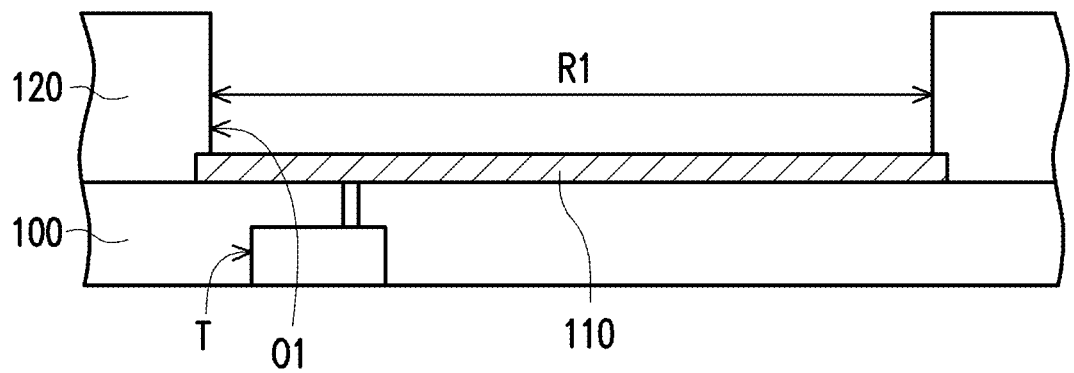

Referring to FIG. 2B, a patterned pixel define layer 120 is formed on the substrate 100. The patterned pixel define layer 120 has a first opening O1. The first opening O1 exposes the first electrode 110, and a projected area of the first electrode 110 on the substrate 100 is larger than a projected area of the first opening O1 on the substrate 100, for example. The projected area of the first opening O1 on the substrate 100 is A, so as to define an area of a first light-emitting region R1. In some embodiments, a method of forming the patterned pixel define layer 120 includes, for example, forming a material layer on the substrate 100. Then, a photolithography process is performed to pattern the material layer, so as to form the patterned pixel define layer 120.

Figure 2C:
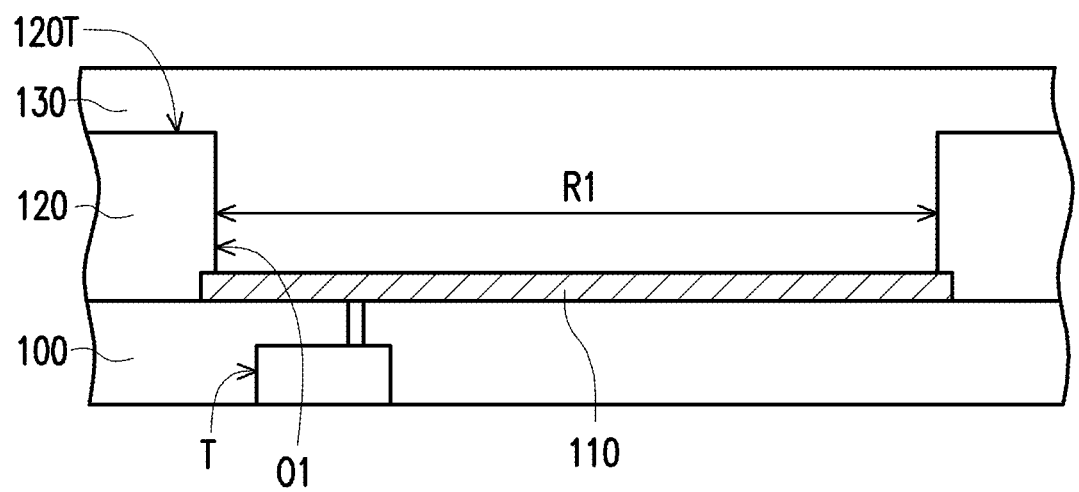

Referring to FIG. 2C, a first color layer 130 is formed in the first opening O1. The first color layer 130 is electrically connected to the first electrode 110. In the embodiment, the first color layer 130 fills the first opening O1, and a portion of the first color layer 130 covers a portion of a top surface 120T of the patterned pixel define layer 120. In other words, a projected area of the first color layer 130 on the substrate 100 is larger than the projected area of the first opening O1 on the substrate 100, for example.

Figure 2D:
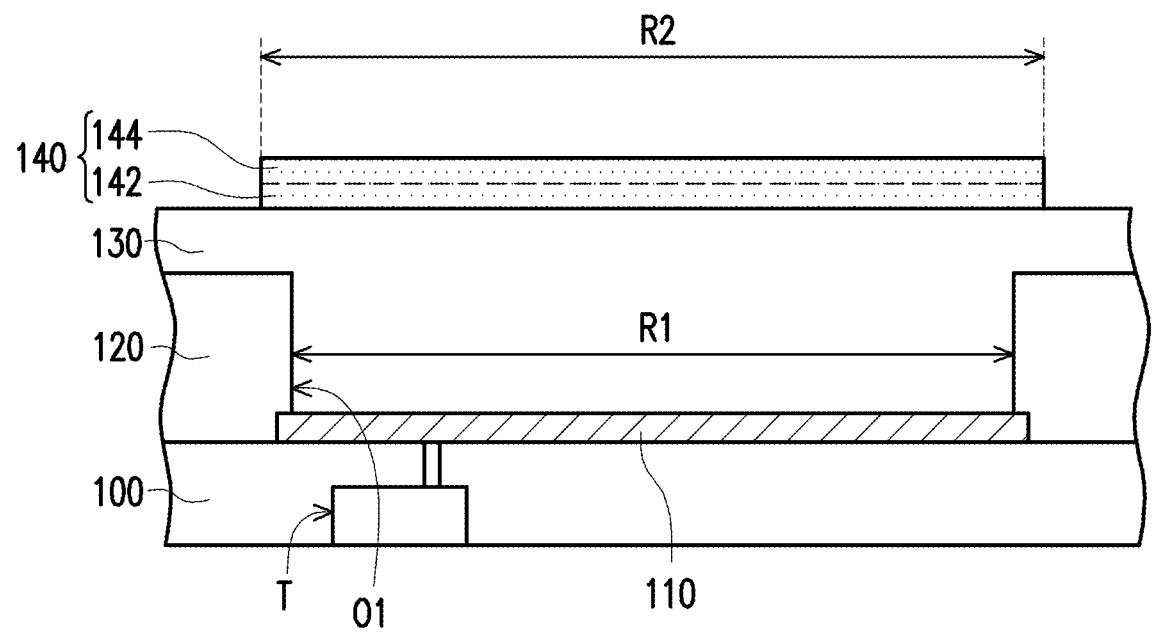

Referring to FIG. 2D, a first connection layer 140 is formed on the first color layer 130. A projected area of the first connection layer 140 on the substrate 100 is B, so as to define an area of a second light-emitting region R2. In the embodiment, a projection of the first connection layer 140 in a direction perpendicular to the substrate is overlapped with a projection of the first opening O1 in the direction perpendicular to the substrate. A portion of the projection of the first connection layer 140 in the direction perpendicular to the substrate 100 is overlapped with a projection of the patterned pixel define layer 120 in the direction perpendicular to the substrate 100. Namely, a portion of an orthogonal projection of the first connection layer 140 on the substrate 100 is overlapped with an orthogonal projection of the patterned pixel define layer 120 on the substrate 100. In the embodiment, the projected area B of the first connection layer 140 on the substrate 100 is larger than the projected area A of the first opening O1 on the substrate 100. The area of the second light-emitting region R2 defined by the first connection layer 140 is larger than the area of the first light-emitting region R1 defined by the first opening O1.

The first connection layer 140 is, for example, formed of a stack of a plurality of conductive layers. For instance, the first connection layer 140 includes an N-type semiconductor layer 142 and a P-type semiconductor layer 144. In the embodiment, the first connection layer 140 includes two conductive layers, but the invention is not limited thereto. The first connection layer 140 may further including more conductive layers. In some embodiments, the first connection layer 140 is selected from a conductive material, such as a doped or non-doped organic semiconductor material including a group consisting of molybdenum trioxide ($MoO_3$), tungsten trioxide ($WO_3$), lithium, and cesium, for example. Additionally, the first color layer 130 and the first connection layer 140 may further include other film layers therebetween, such as an electron transport layer or an electron injection layer.

Figure 2E:
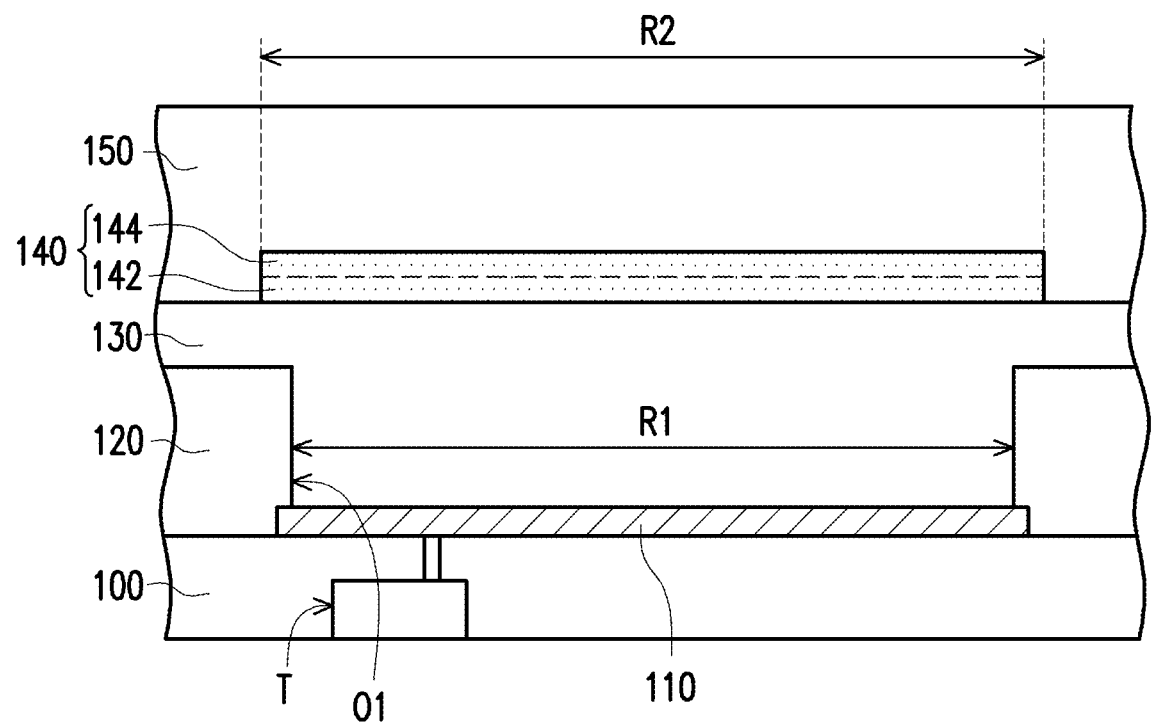

Referring to FIG. 2E, a second color layer 150 is formed on the first connection layer 140. The first connection layer 140 is located between the first color layer 130 and the second color layer 150. The first color layer 130 and the second color layer 150 may be excited to emit light of different colors. The second color layer 150 covers the entire first connection layer 140. A projected area of the second color layer 150 on the substrate 100 is larger than or equal to the projected area of the first connection layer 140 on the substrate 100, for example, but the invention is not limited thereto. In the embodiment, a portion of the second color layer 150 is in contact with a portion of the first color layer 130.

Figure 2F:
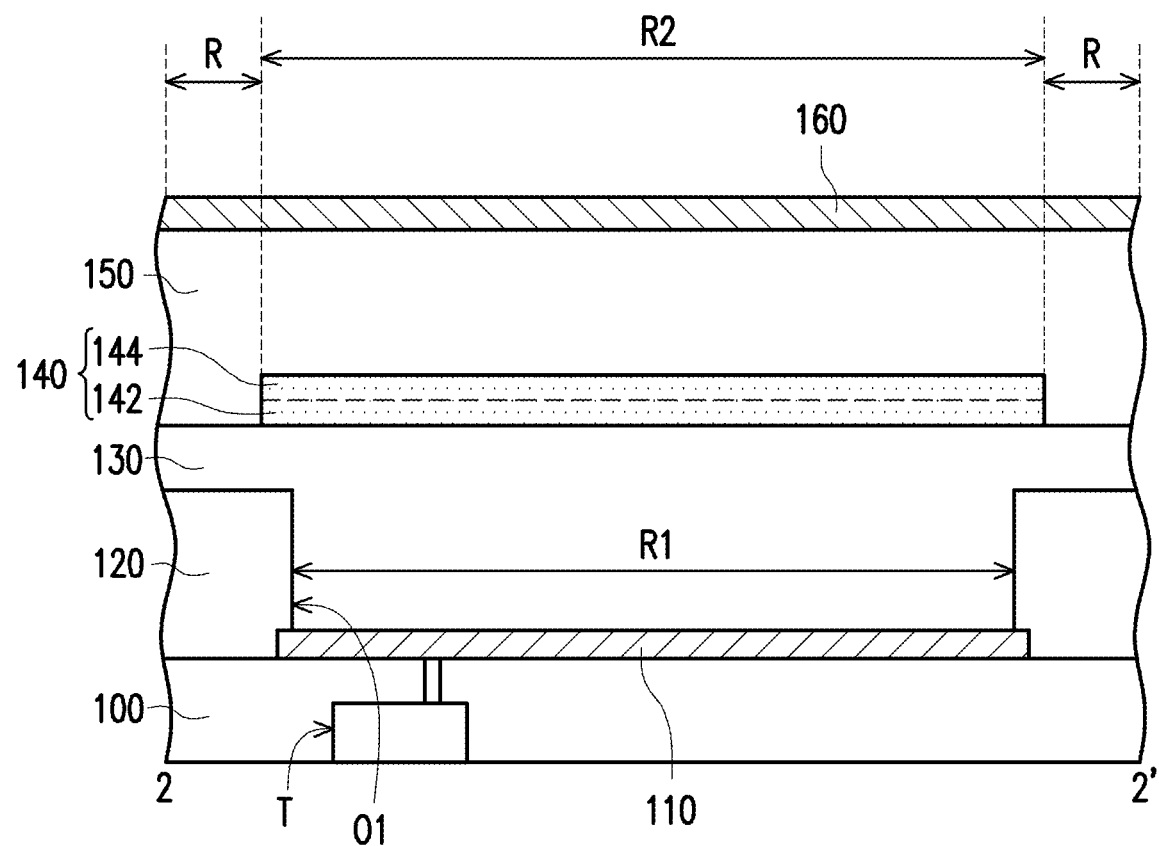

Referring to FIG. 1 and FIG. 2F, a second electrode 160 is formed on the second color layer 150. The second electrode 160 is, for example, electrically connected to a common voltage but the invention is not limited thereto. A projected area of the second electrode 160 on the substrate 100 is larger than or equal to the projected area of the first connection layer 140 on the substrate 100, for example, but the invention is not limited thereto. In the embodiment, a region where the first connection layer 140 is not overlapped with the second electrode 160 is a dark region R. Additionally, in an embodiment, the first color layer 130 and the second color layer 150 may be formed of a stack of a plurality of film layers, such as formed of a stack of a hole injection layer, a hole transport layer, a light-emitting layer, a hole injection layer, and a hole transport layer, but the invention is not limited thereto. In other embodiments, it may add more film layers or reduce the film layers according to the requirements.

In the embodiment, the electroluminescent device includes the substrate 100, the first electrode 110, the patterned pixel define layer 120, the first color layer 130, the first connection layer 140, the second color layer 150, and the second electrode 160. The first electrode 110 is located on the substrate 100. The patterned pixel define layer 120 is located on the substrate 100, and the patterned pixel define layer 120 has the first opening O1. The projected area of the first opening O1 on the substrate 100 is A, so as to define the area of the first light-emitting region R1. The first color layer 130 is located in the first opening O1 and electrically connected to the first electrode 110. The first connection layer 140 is located on the first color layer 130. The projected area of the first connection layer 140 on the substrate 100 is B, so as to define the area of the second light-emitting region R2. The first connection layer 140 is located between the first color layer 130 and the second color layer 150. The second color layer 150 is located on the first connection layer 140, and located between the first connection layer 140 and the second electrode 160.

In some embodiments, A and B may be preset to different sizes, so that the light emitted by the electroluminescent device has a desired color temperature. For instance, when a ratio of B to A is r1, the light emitted by the electroluminescent device has a first color temperature T1; when the ratio of B to A is r2, the light emitted by the electroluminescent device has a second color temperature T2. r1 is different from r2, and the first color temperature T1 is different from the second color temperature T2.

In some embodiments, the first color layer 130 includes a yellow electroluminescent material, and is used to emit yellow light; the second color layer 150 includes a blue electroluminescent material, and is used to emit blue light. When r1 is larger than r2, the first color temperature T1 is higher than the second color temperature T2. When the ratio of B to A is higher, the color temperature of the light emitted by the electroluminescent device is higher.

Figure 11A:
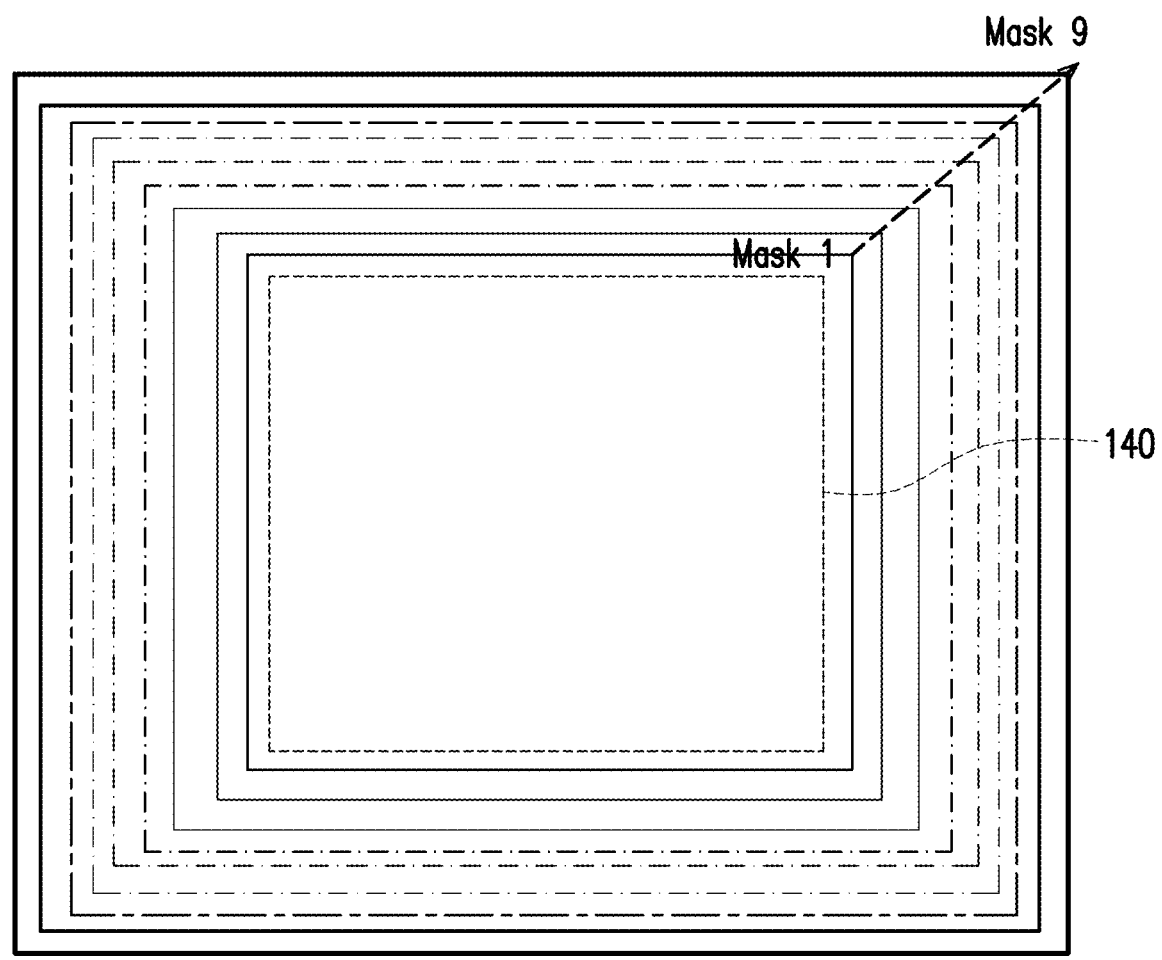
FIG. 11A is a schematic views of connection layers formed using masks with openings in different sizes according to some embodiments of the invention.
Figure 11B:
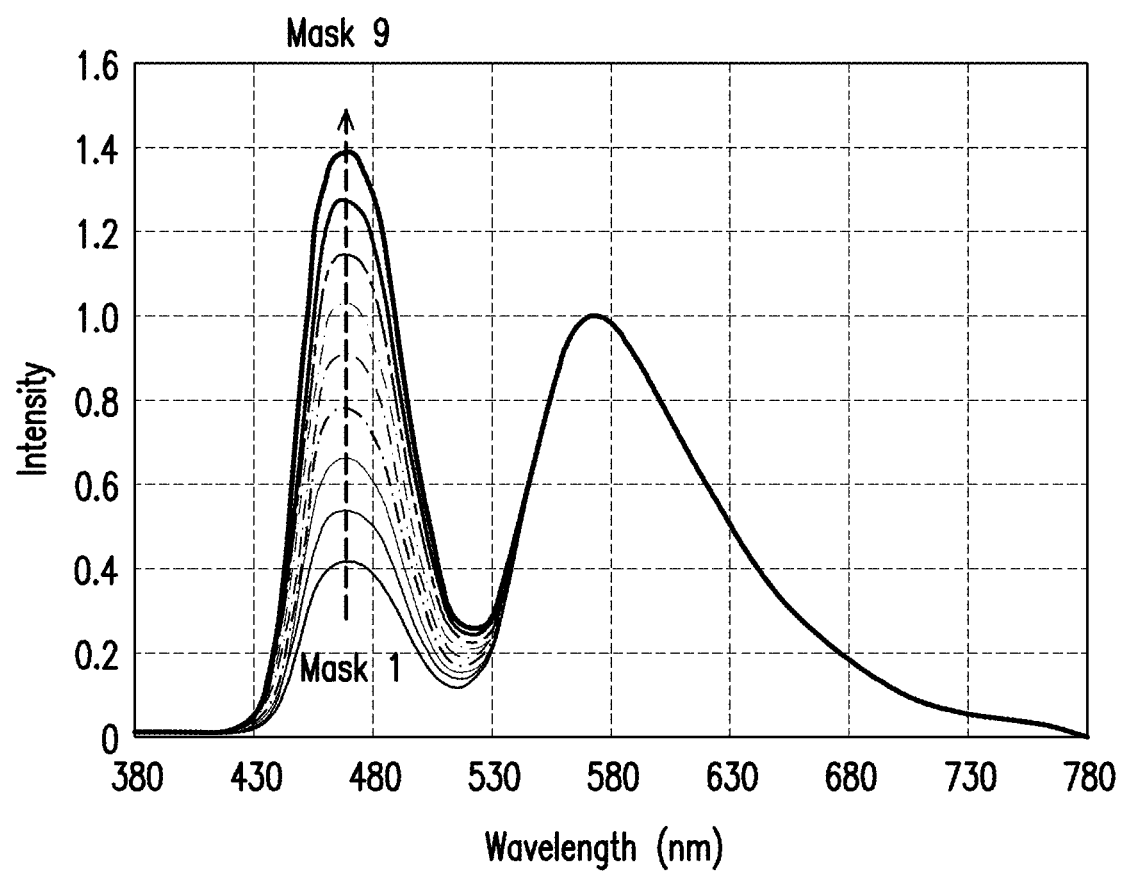
FIG. 11B is a luminescence spectrum of the electroluminescent devices with the connection layers formed using the masks with the openings in different sizes according to some embodiments of the invention.
Figure 11C:
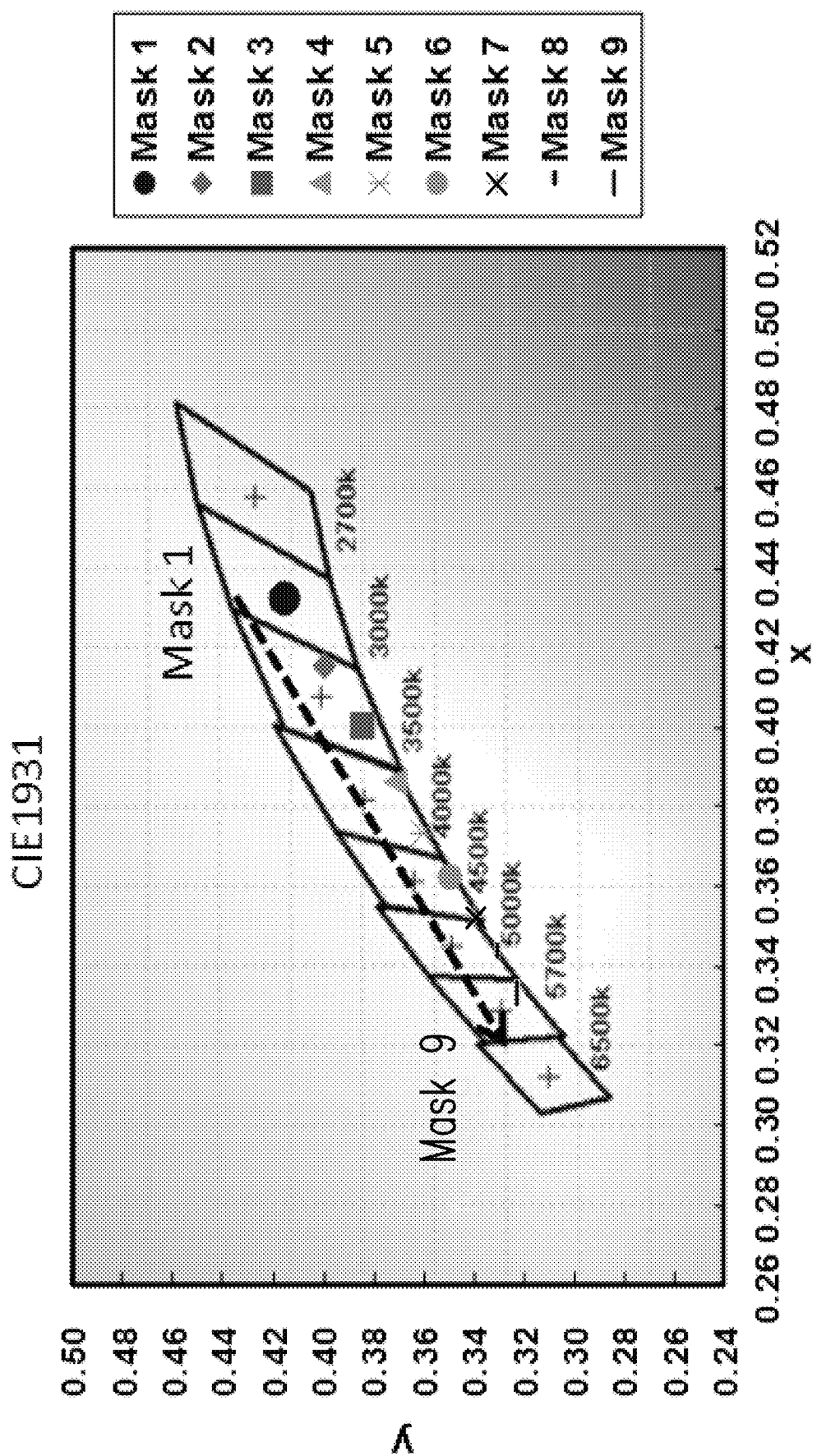
FIG. 11C is a CIE1931 color space diagram of the electroluminescent devices with the connection layers formed using the masks with the openings in different sizes according to some embodiments of the invention.

Referring to FIG. 11A, the first connection layer 140 in different sizes may be formed by a mask 1 to a mask 9 having openings in different sizes, wherein the sizes of the openings of the mask 1 to the mask 9 are increased sequentially. In other words, an area of the first connection layer 140 formed by the mask 1 is smallest, and an area of the first connection layer 140 formed by the mask 9 is largest. Referring to FIG. 11B and FIG. 11C, in the embodiment that the first color layer 130 includes the yellow electroluminescent material and the second color layer 150 includes the blue electroluminescent material, a content of blue light in the light emitted by the electroluminescent device will increase if the area of the first connection layer 140 is increased. In other words, with the increase of the area of the first connection layer 140, the color temperature of the light emitted by the electroluminescent device will higher.

In some embodiments, the first color layer 130 includes the blue electroluminescent material, and is used to emit the blue light; the second color layer 150 includes the yellow electroluminescent material, and is used to emit the yellow light. When r1 is larger than r2, the first color temperature T1 is lower than the second color temperature T2. When the ratio of B to A is higher, the color temperature of the light emitted by the electroluminescent device is lower.

Based on the above, by changing the size of the first opening and the size of the first connection layer in the electroluminescent device, the color temperature of the light emitted by the electroluminescent device may be changed. Since adjusting the size of the first opening and the size of the first connection layer will not change the forming order of each conductive layer or electrode layer, the difficulty of process of the electroluminescent device may be reduced, and the effect of adjusting the color temperature of the electroluminescent device on the luminous efficiency thereof may also be reduced.

Figure 3:
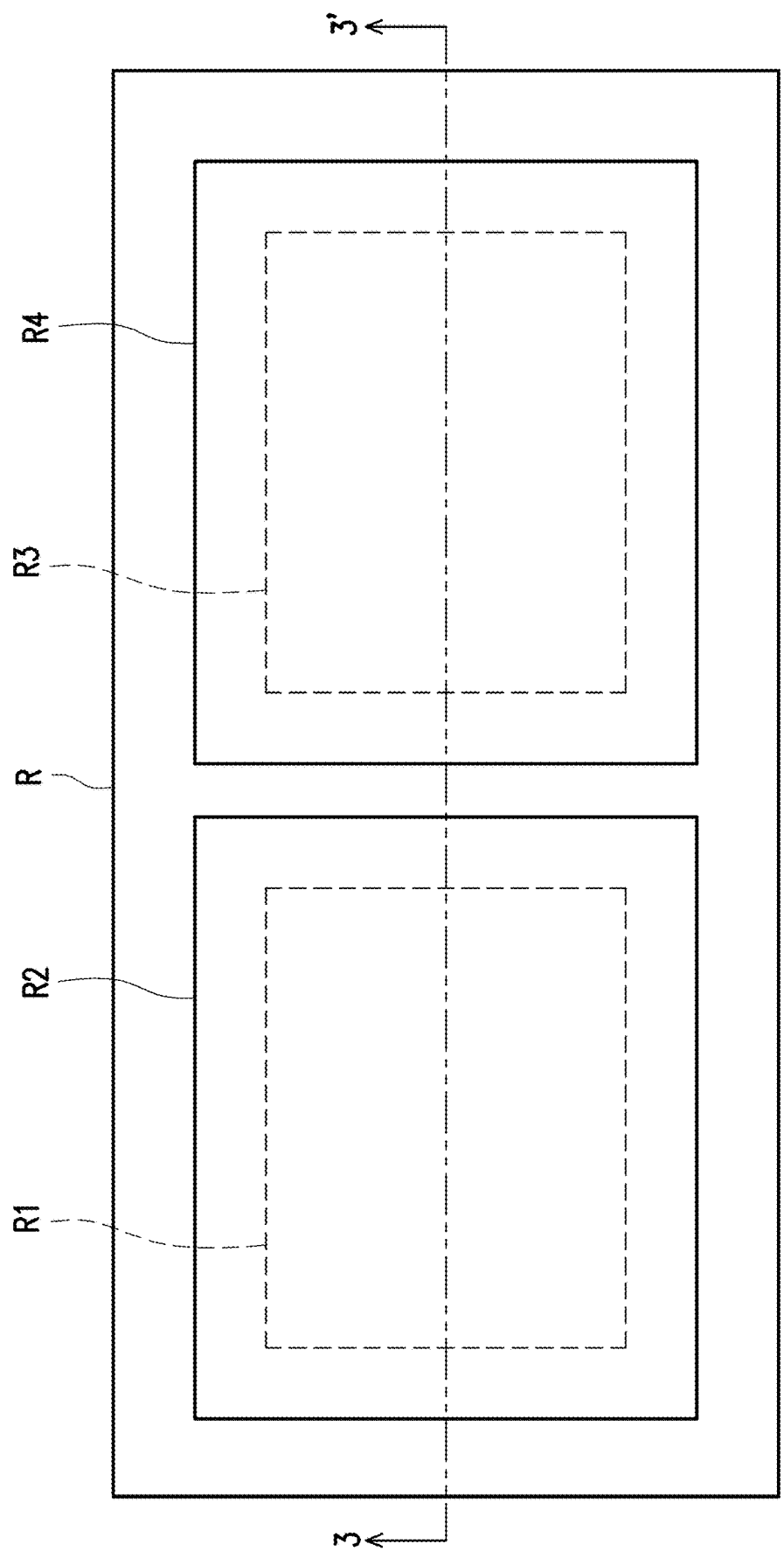
FIG. 3 is a schematic top view of an electroluminescent device according to a second embodiment of the invention.

FIG. 3 is a schematic top view of an electroluminescent device according to a second embodiment of the invention. FIG. 4A to FIG. 4F are schematic cross-sectional views of a manufacturing method of the electroluminescent device of FIG. 3 along a section line 3-3'. It should be noted that the reference numerals and a part of the contents in the embodiments of FIG. 1 and FIG. 2A to FIG. 2F are used in the embodiments of FIG. 3 and FIG. 4A to FIG. 4F, in which identical or similar reference numerals indicate identical or similar elements, and repeated description of the same technical contents is omitted. The omitted part of the description can refer to the foregoing embodiment, which is not repeated herein.

Figure 4A:
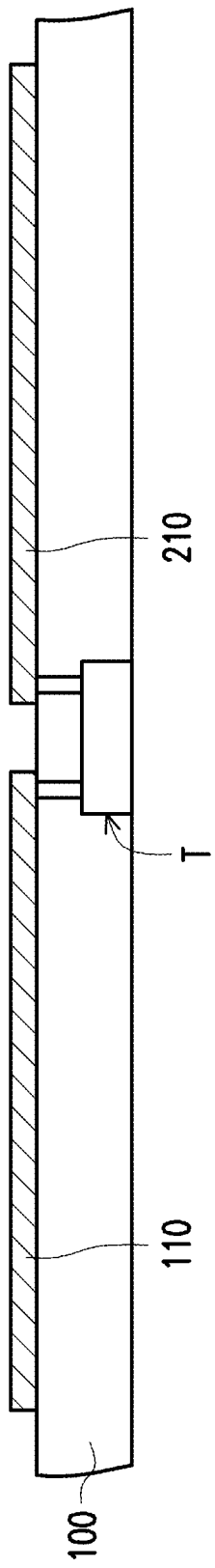
FIG. 4A to FIG. 4F are schematic cross-sectional views of a manufacturing method of the electroluminescent device of FIG. 3 along a section line 3-3'.

Referring to FIG. 4A, the first electrode 110 and a third electrode 210 are formed on the substrate 100. The third electrode 210 and the first electrode 110 are, for example, formed in the same step (or by the same patterned process). In some embodiments, the first electrode 110 and the third electrode 210 are electrically connected to the switch device T located in the substrate 100. The first electrode 110 and the third electrode 210 may be electrically connected to the same or different switch devices.

Figure 4B:
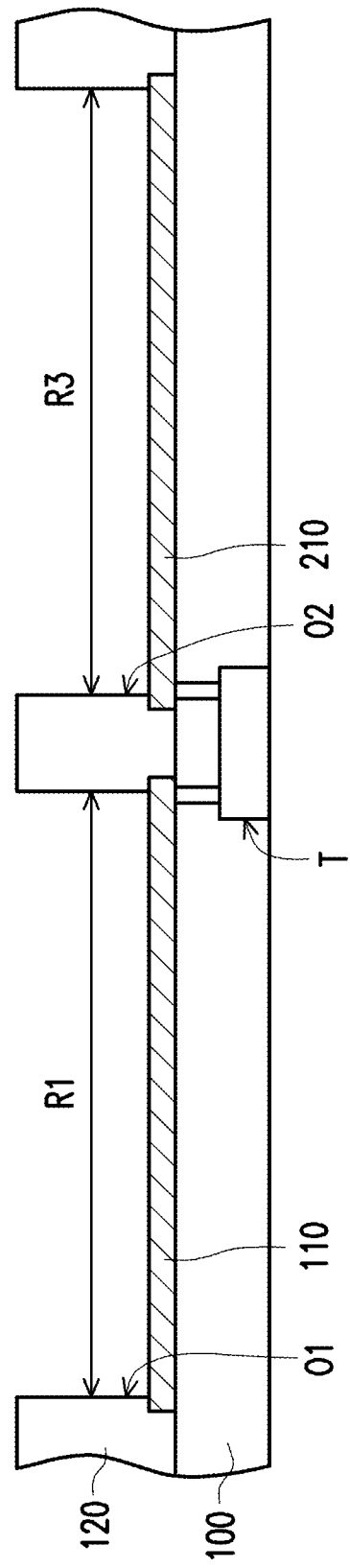

Referring to FIG. 4B, the patterned pixel define layer 120 is formed on the substrate 100. The patterned pixel define layer 120 has the first opening O1 and a second opening O2. The second opening O2 exposes the second electrode 210, and a projected area of the second electrode 210 on the substrate 100 is larger than a projected area of the second opening O2 on the substrate 100, but the invention is not limited thereto. The projected area of the second opening O2 on the substrate 100 is C, so as to define an area of a third light-emitting region R3. The area of the first light-emitting region R1 may be the same as or different from the area of the third light-emitting region R3.

Figure 4C:
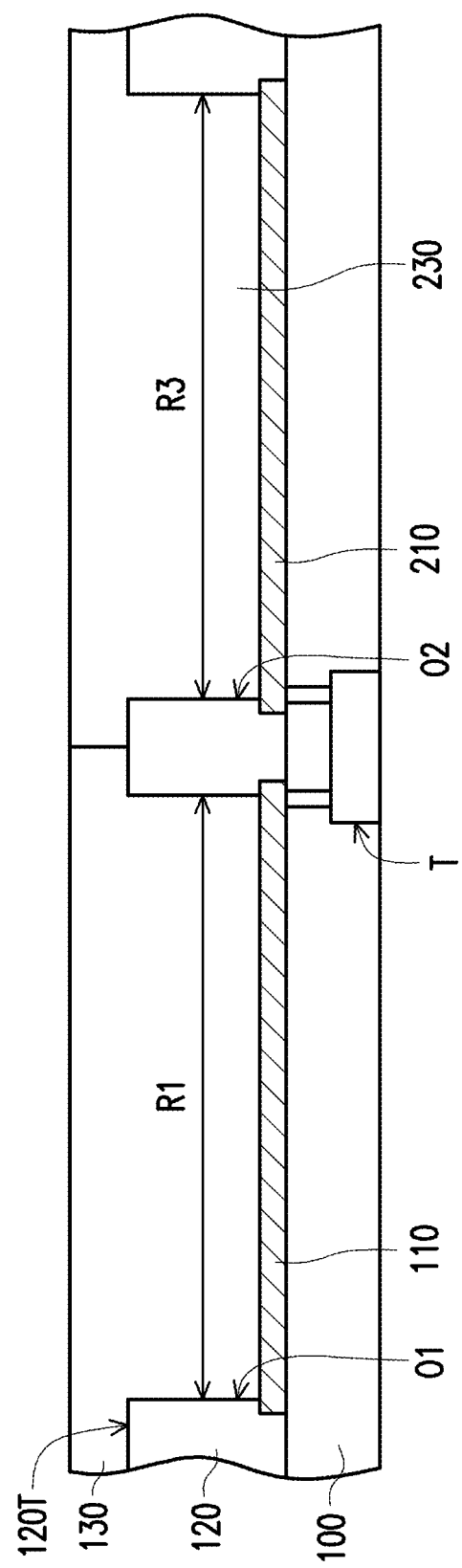

Referring to FIG. 4C, the first color layer 130 is formed in the first opening O1. The first color layer 130 is electrically connected to the first electrode 110. A third color layer 230 is formed in the second opening O2. The third color layer 230 is electrically connected to the third electrode 210. In the embodiment, the third color layer 230 fills the second opening O2, and a portion of the third color layer 230 covers a portion of the top surface 120T of the patterned pixel define layer 120. In other words, a projected area of the third color layer 230 on the substrate 100 is, for example, larger than the projected area of the second opening O2 on the substrate 100.

In some embodiments, the first color layer 130 and the third color layer 230 include the same electroluminescent material, for example. The first color layer 130 and the third color layer 230 may be formed simultaneously, but the invention is not limited thereto. In some embodiments, the first color layer 130 and the third color layer 230 may include different electroluminescent materials. The first color layer 130 and the third color layer 230 may be connected to each other or separated from each other.

Figure 4D:
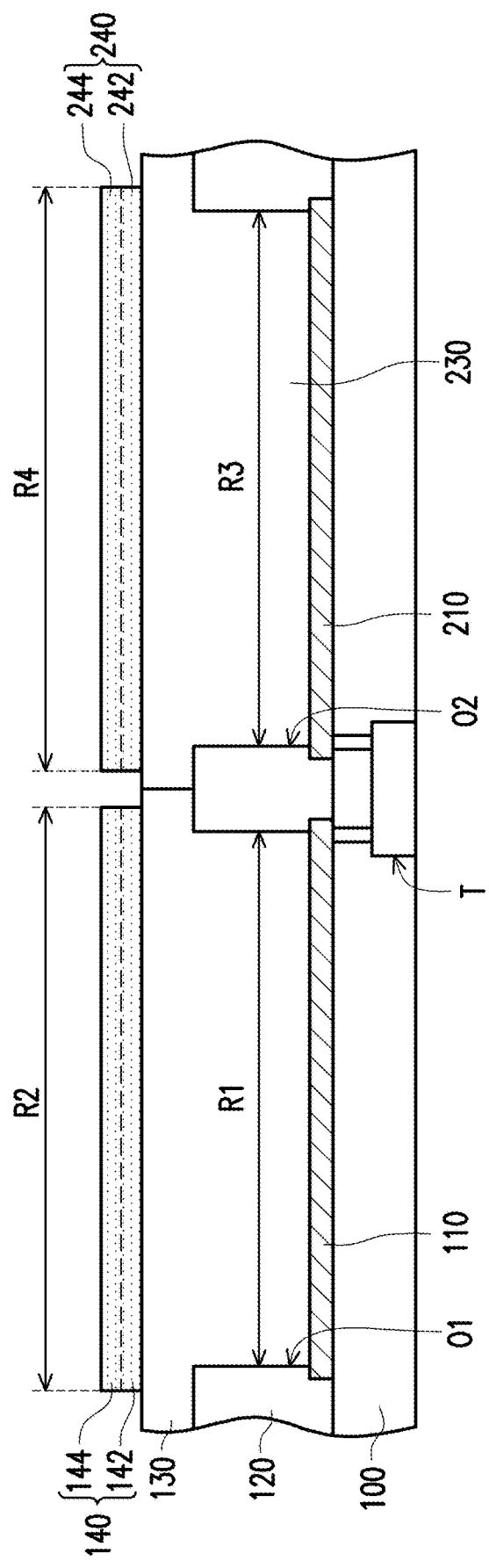

Referring to FIG. 4D, the first connection layer 140 is formed on the first color layer 130. The projected area of the first connection layer 140 on the substrate 100 is B, so as to define the area of the second light-emitting region R2. A second connection layer 240 is formed on the second color layer 230. A projected area of the second connection layer 240 on the substrate 100 is D, so as to define an area of a fourth light-emitting region R4. The second connection layer 240 and the first connection layer 140 include the same or different materials, for example. For instance, the second connection layer 240 includes an N-type semiconductor layer 242 and a P-type semiconductor layer 244, but the invention is not limited thereto. In the embodiment, a projection of the second connection layer 240 in the direction perpendicular to the substrate is overlapped with a projection of the second opening O2 in the direction perpendicular to the substrate. A portion of the projection of the second connection layer 240 in the direction perpendicular to the substrate is overlapped with the projection of the patterned pixel define layer 120 in the direction perpendicular to the substrate. Namely, a portion of an orthogonal projection of the second connection layer 240 on the substrate 100 is overlapped with the orthogonal projection of the patterned pixel define layer 120 on the substrate 100. The projected area of the second connection layer 240 on the substrate 100 is larger than the projected area of the second opening O2 on the substrate 100, for example. In the embodiment, D is larger than C. The area D of the fourth light-emitting region R4 defined by the second connection layer 240 is larger than the area C of the third light-emitting region R3 defined by the second opening O2, but the invention is not limited thereto. In some embodiments, D is smaller than or equal to C. The area of the fourth light-emitting region R4 defined by the second connection layer 240 is smaller than or equal to the area of the third light-emitting region R3 defined by the second opening O2.

Figure 4E:
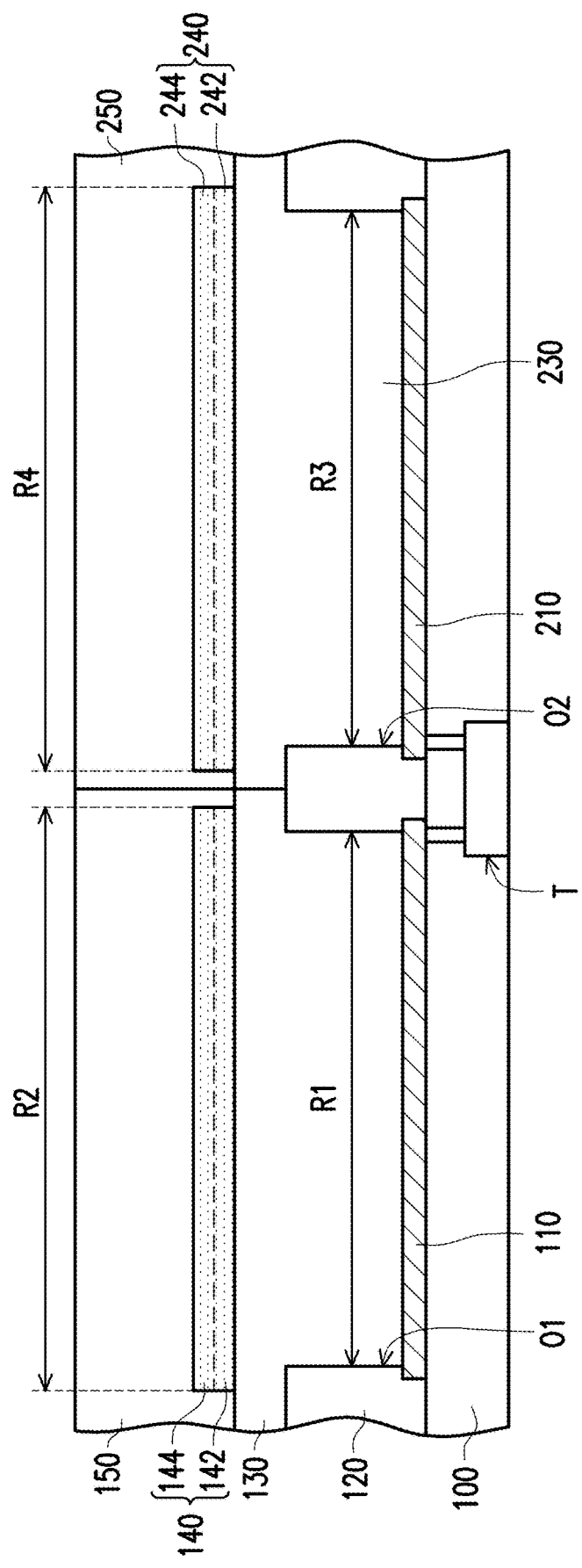

Referring to FIG. 4E, the second color layer 150 is formed on the first connection layer 140. The first connection layer 140 is located between the first color layer 130 and the second color layer 150. A fourth color layer 250 is formed on the second connection layer 240. The second connection layer 240 is located between the third color layer 230 and the fourth color layer 250. The fourth color layer 250 and the third color layer 230 may be excited to emit light of the same color or different colors, for example. The fourth color layer 250 covers the entire second connection layer 240. A projected area of the fourth color layer 250 on the substrate 100 is larger than or equal to the projected area of the second connection layer 240 on the substrate 100, for example. In the embodiment, a portion of the fourth color layer 250 is in contact with a portion of the third color layer 230, but the invention is not limited thereto. In some embodiments, the fourth color layer 250 and the third color layer 230 may be separated from each other.

Figure 4F:
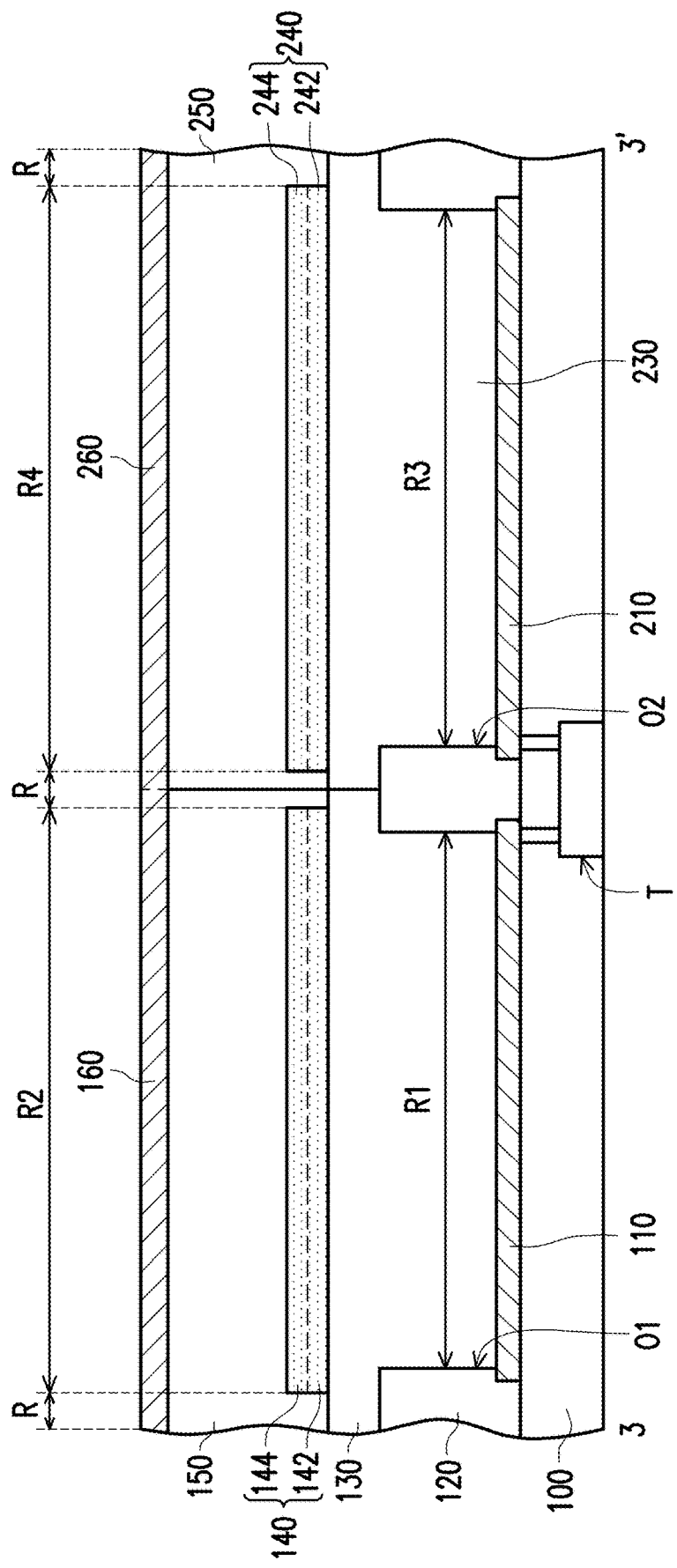

Referring to FIG. 3 and FIG. 4F, the second electrode 160 is formed on the second color layer 150. A fourth electrode 260 is formed on the fourth color layer 250. The second electrode 160 and the fourth electrode 260 are formed in the same step, for example. The second electrode 160 and the fourth electrode 260 are connected to each other, but the invention is not limited thereto. A projected area of the fourth electrode 260 on the substrate 100 is larger than or equal to the projected area of the second connection layer 240 on the substrate 100, for example, but the invention is not limited thereto. In the embodiment, a region where the first connection layer 140 and the second connection layer 240 are not overlapped with the second electrode 160 and the fourth electrode 260 is a dark region R. Additionally, in an embodiment, the third color layer 230 and the fourth color layer 250 may be formed of a stack of a plurality of film layers, such as formed of a stack of a hole injection layer, a hole transport layer, a light-emitting layer, a hole injection layer, and a hole transport layer, but the invention is not limited thereto. In other embodiments, it may add more film layers or reduce the film layers according to the requirements.

In the embodiment, the electroluminescent device includes the substrate 100, the first electrode 110, the patterned pixel define layer 120, the first color layer 130, the first connection layer 140, the second color layer 150, the second electrode 160, the third electrode 210, the third color layer 230, the second connection layer 240, the fourth color layer 250, and the fourth electrode 260. The first electrode 110 and the third electrode 210 are located on the substrate 100. The patterned pixel define layer 120 is located on the substrate 100, and the patterned pixel define layer 120 has the first opening O1 and the second opening O2. The projected area of the first opening O1 on the substrate 100 is A, so as to define the area of the first light-emitting region R1. The projected area of the second opening O2 on the substrate 100 is C, so as to define the area of the third light-emitting region R3. The first color layer 130 is located in the first opening O1 and electrically connected to the first electrode 110. The third color layer 230 is located in the second opening O2 and electrically connected to the third electrode 210. The first connection layer 140 is located on the first color layer 130. The projected area of the first connection layer 140 on the substrate 100 is B, so as to define the area of the second light-emitting region R2. The first connection layer 140 is located between the first color layer 130 and the second color layer 150. The second color layer 150 is located between the first connection layer 140 and the second electrode 160. The second connection layer 240 is located on the third color layer 230. The projected area of the second connection layer 240 on the substrate 100 is D, so as to define the area of the fourth light-emitting region R4. The fourth color layer 250 is located on the second connection layer 240, and located between the second connection layer 240 and the fourth electrode 260.

In some embodiments, A, B, C, and D may be preset to different sizes, so that the light emitted by the electroluminescent device has the desired color temperature.

In some embodiments, the fourth color layer 250, the third color layer 230, and the second color layer 150 include the same or different blue electroluminescent materials, and the first color layer 130 includes the yellow electroluminescent material.

Figure 5A:
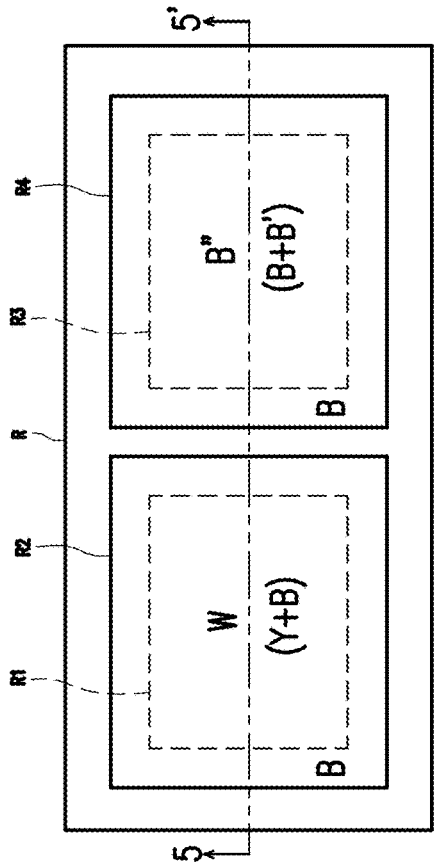
FIG. 5A is a schematic top view of an electroluminescent device according to a variant embodiment of the invention.
Figure 5B:
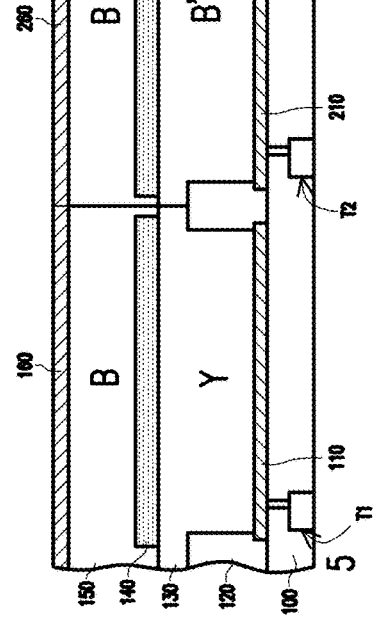
FIG. 5B is a schematic cross-sectional view of the electroluminescent device of FIG. 5A along a section line 4-4'.

In some variant embodiments of the second embodiment, as shown in the embodiment of FIG. 5A and FIG. 5B, the fourth color layer 250, the third color layer 230, and the second color layer 150 are used to emit first blue light B, and the first color layer 130 is used to emit yellow light Y. The first light-emitting region R1 emits white light W formed by mixing the yellow light Y and the first blue light B. The second light-emitting region R2, the third light-emitting region R3, and the fourth light-emitting region R4 emit the first blue light B. In addition, in the embodiment, it may further include the switch device T disposed in the substrate 100. The first electrode 110 and the third electrode 210 are electrically connected to the switch device T. In other words, the switch device T may provide an electrical signal for the first electrode 110 and the third electrode 210 simultaneously.

Figure 6A:
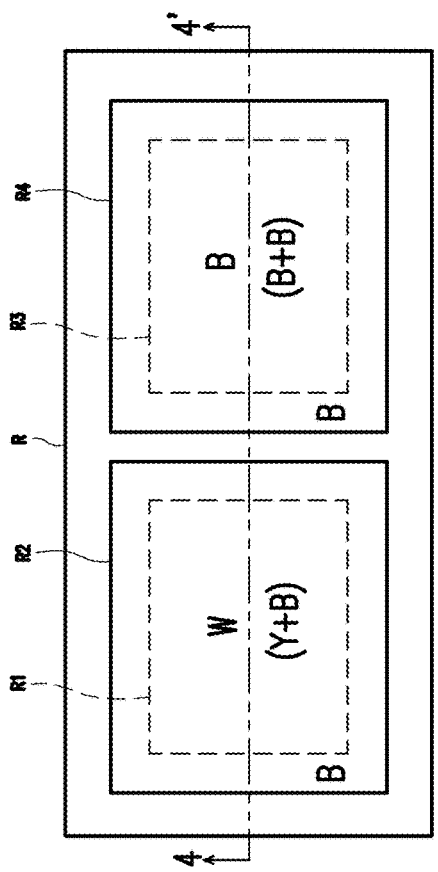
FIG. 6A is a schematic top view of an electroluminescent device according to a variant embodiment of the invention.
Figure 6B:
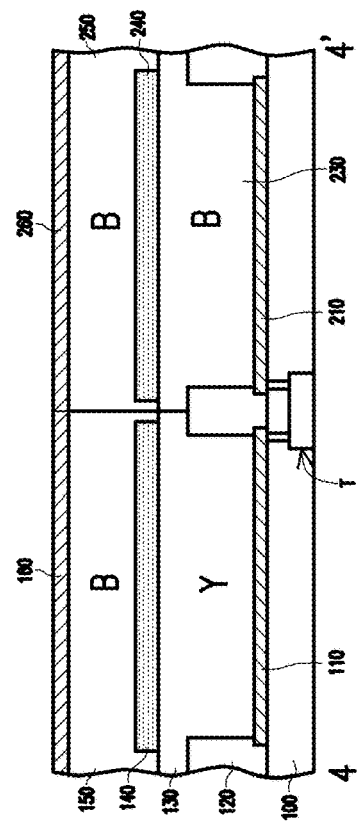
FIG. 6B is a schematic cross-sectional view of the electroluminescent device of FIG. 6A along a section line 5-5'.

In the embodiment of FIG. 6A and FIG. 6B, the fourth color layer 250 and the second color layer 150 are used to emit the first blue light B, the third color layer 230 is used to emit second blue light B', and the first color layer 130 is used to emit the yellow light Y. The first light-emitting region R1 emits the white light W formed by mixing the yellow light Y and the first blue light B. The third light-emitting region R3 emits third blue light B" formed by mixing the first blue light B and the second blue light B'. The second light-emitting region R2 and the fourth light-emitting region R4 emit the first blue light B. In addition, in the embodiment, it may further include a first switch device T1 and a second switch device T2. The first switch device T1 and the second switch device T2 are disposed in the substrate 100. The first electrode 110 is electrically connected to the first switch device T1. The third electrode 210 is electrically connected to the second switch device T2. The electrical signal of the first electrode 110 and the third electrode 210 are provided from different switch devices. Besides, the switch devices are omitted in the figures of the following embodiments. The electrical signal of the first electrode 110 and the third electrode 210 may be provided from the same switch device or different switch devices.

Figure 7A:
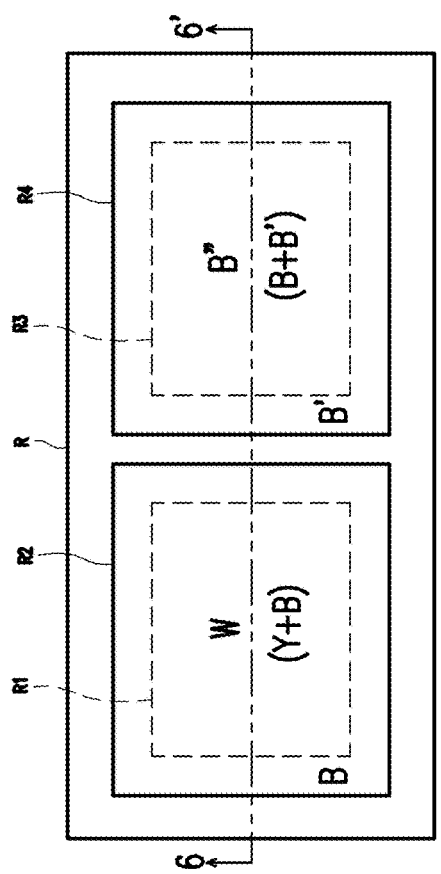
FIG. 7A is a schematic top view of an electroluminescent device according to a variant embodiment of the invention.
Figure 7B:
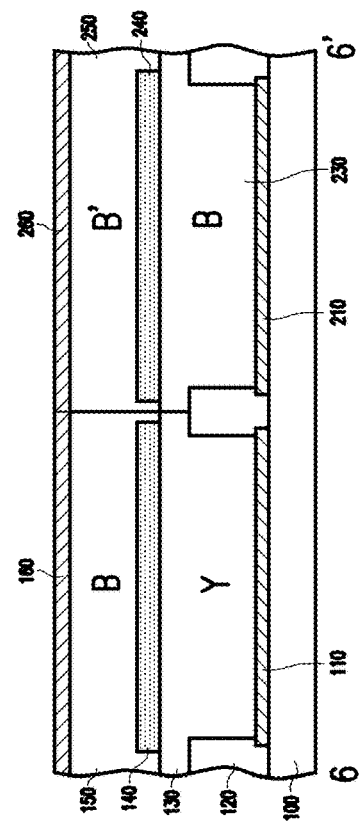
FIG. 7B is a schematic cross-sectional view of the electroluminescent device of FIG. 7A along a section line 6-6'.

In the embodiment of FIG. 7A and FIG. 7B, the third color layer 230 and the second color layer 150 are used to emit the first blue light B, the fourth color layer 250 is used to emit the second blue light B', and the first color layer 130 is used to emit the yellow light Y. The first light-emitting region R1 emits the white light W formed by mixing the yellow light Y and the first blue light B. The second light-emitting region R2 emits the first blue light B. The third light-emitting region R3 emits the third blue light B" formed by mixing the first blue light B and the second blue light B'. The fourth light-emitting region R4 emits the second blue light B'.

In some embodiments, the fourth color layer 250, the third color layer 230, and the first color layer 130 include the same or different blue electroluminescent materials, and the second color layer 150 includes the yellow electroluminescent material. Since three of the first color layer 130, the second color layer 150, the third color layer 230, and the fourth color layer 250 include the blue electroluminescent materials, the quality of the electroluminescent device is less likely to be affected by a shorter life of the blue electroluminescent material.

Figure 8A:
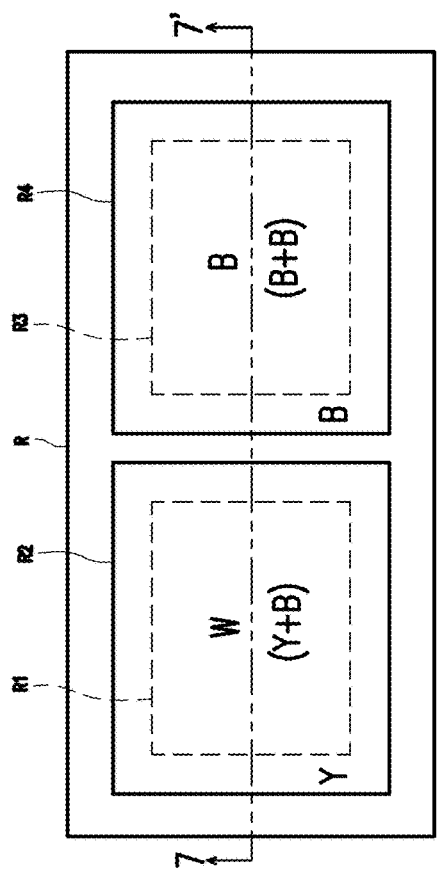
FIG. 8A is a schematic top view of an electroluminescent device according to a variant embodiment of the invention.
Figure 8B:
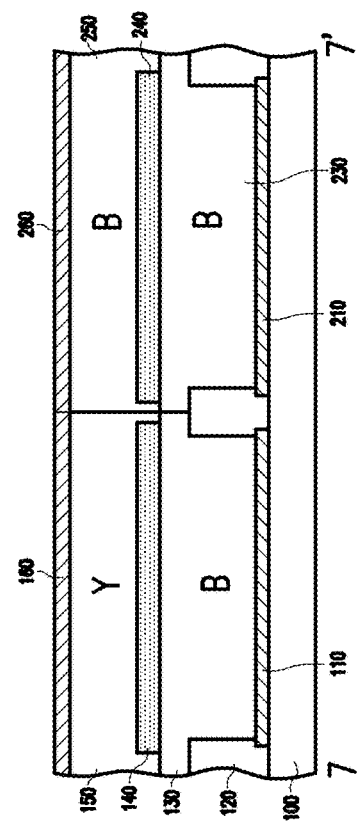
FIG. 8B is a schematic cross-sectional view of the electroluminescent device of FIG. 8A along a section line 7-7'.

In the embodiment of FIG. 8A and FIG. 8B, the fourth color layer 250, the third color layer 230, and the first color layer 130 are used to emit the first blue light B, and the second color layer 150 is used to emit the yellow light Y. The first light-emitting region R1 emits the white light W formed by mixing the yellow light Y and the first blue light B. The second light-emitting region R2 emits the yellow light Y. The third light-emitting region R3 and the fourth light-emitting region R4 emit the first blue light B.

Figure 9A:
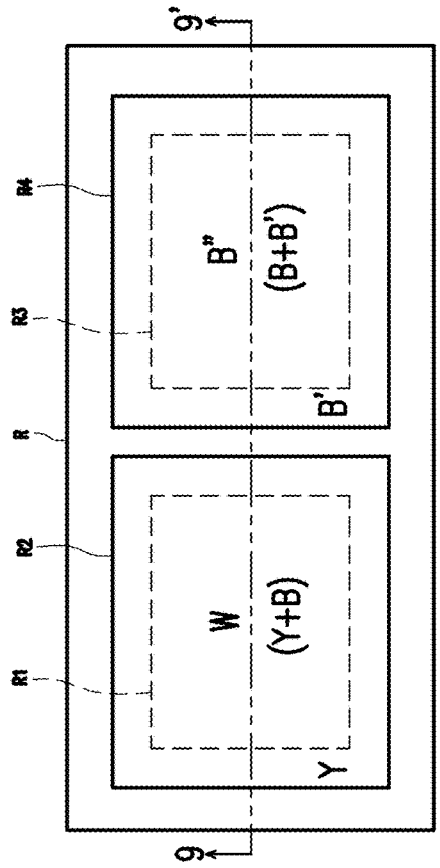
FIG. 9A is a schematic top view of an electroluminescent device according to a variant embodiment of the invention.
Figure 9B:
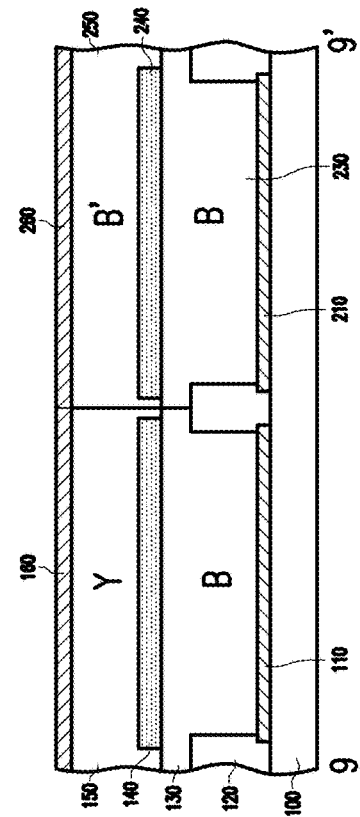
FIG. 9B is a schematic cross-sectional view of the electroluminescent device of FIG. 9A along a section line 8-8'.

In the embodiment of FIG. 9A and FIG. 9B, the fourth color layer 250 and the first color layer 130 are used to emit the first blue light B, the third color layer 230 is used to emit the second blue light B', and the second color layer 150 is used to emit the yellow light Y. The first light-emitting region R1 emits the white light W formed by mixing the yellow light Y and the first blue light B. The second light-emitting region R2 emits the yellow light Y. The third light-emitting region R3 emits the third blue light B" formed by mixing the first blue light B and the second blue light B'. The fourth light-emitting region R4 emits the first blue light B.

Figure 10A:
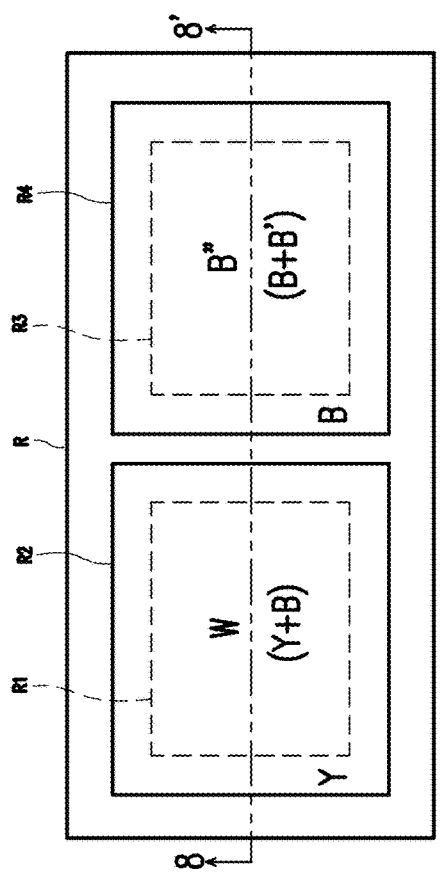
FIG. 10A is a schematic top view of an electroluminescent device according to a variant embodiment of the invention.
Figure 10B:
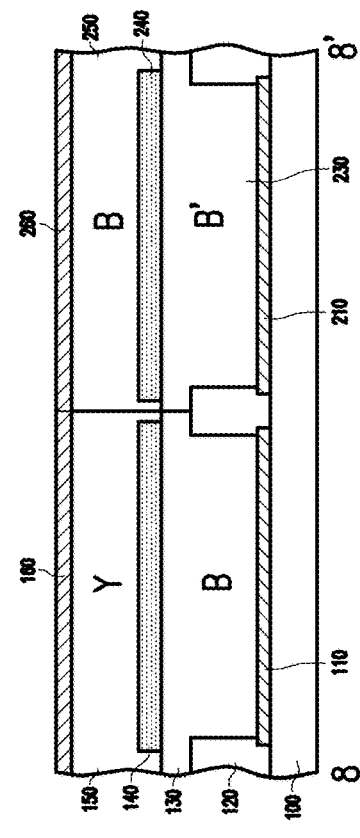
FIG. 10B is a schematic cross-sectional view of the electroluminescent device of FIG. 10A along a section line 9-9'.

In the embodiment of FIG. 10A and FIG. 10B, the third color layer 230 and the first color layer 130 are used to emit the first blue light B, the fourth color layer 250 is used to emit the second blue light B', and the second color layer 150 is used to emit the yellow light Y. The first light-emitting region R1 emits the white light W formed by mixing the yellow light Y and the first blue light B. The second light-emitting region R2 emits the yellow light Y. The third light-emitting region R3 emits the third blue light B" formed by mixing the first blue light B and the second blue light B'. The fourth light-emitting region R4 emits the second blue light B'.

Based on the above, by adjusting the size of the first opening, the size of the first connection layer, the size of the second opening, and the size of the second connection layer in the electroluminescent device, the color temperature of the light emitted by the electroluminescent device may be changed. Since adjusting the size of the first opening, the size of the first connection layer, the size of the second opening, and the size of the second connection layer will not change the forming order of each conductive layer or electrode layer, the difficulty of process of the electroluminescent device may be reduced, and the effect of adjusting the color temperature of the electroluminescent device on the luminous efficiency thereof may also be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. An electroluminescent device, comprising:
a first electrode, located on a substrate;
a patterned pixel define layer, located on the substrate, the patterned pixel define layer having a first opening, and a projected area of the first opening on the substrate being A to define an area of a first light-emitting region, wherein the patterned pixel define layer further has a second opening to define a third light-emitting region;
a first color layer, located in the first opening and electrically connected to the first electrode;
a first connection layer, located on the first color layer, a projected area of the first connection layer on the substrate being B to define an area of a second light-emitting region;

a second color layer, the first connection layer being located between the first color layer and the second color layer; and a second electrode, the second color layer being located between the first connection layer and the second electrode, wherein when a ratio of B to A is r1, light emitted by the electroluminescent device has a first color temperature;

when the ratio of B to A is r2, the light emitted by the electroluminescent device has a second color temperature, r1 is different from r2, and the first color temperature is different from the second color temperature;

a third electrode, located on the substrate;

a third color layer, located in the second opening and electrically connected to the third electrode;

a second connection layer, located on the third color layer to define a fourth light-emitting region;

a fourth color layer, located on the second connection layer; and a fourth electrode, the fourth color layer being located between the second connection layer and the fourth electrode.

2. The electroluminescent device according to claim 1, wherein B is larger than A.

3. The electroluminescent device according to claim 2, wherein a portion of a projection of the first connection layer in a direction perpendicular to the substrate is overlapped with a projection of the patterned pixel define layer in the direction perpendicular to the substrate.

4. The electroluminescent device according to claim 1, wherein the fourth color layer, the third color layer, and the second color layer comprise a blue electroluminescent material, and the first color layer comprises a yellow electroluminescent material.

5. The electroluminescent device according to claim 1, wherein the fourth color layer, the third color layer, and the first color layer comprise a blue electroluminescent material, and the second color layer comprises a yellow electroluminescent material.

6. The electroluminescent device according to claim 1, wherein the first color layer comprises a blue electroluminescent material, and the second color layer comprises a yellow electroluminescent material.

7. The electroluminescent device according to claim 1, wherein the first color layer comprises a yellow electroluminescent material, and the second color layer comprises a blue electroluminescent material.

8. The electroluminescent device according to claim 1, further comprising a switch device disposed in the substrate, the first electrode being electrically connected to the switch device.

9. The electroluminescent device according to claim 1, further comprising a switch device disposed at the substrate, the first electrode and the third electrode being electrically connected to the switch device.

10. A manufacturing method of an electroluminescent device, comprising:

forming a first electrode on a substrate;

forming a patterned pixel define layer on the substrate, the patterned pixel define layer having a first opening, and a projected area of the first opening on the substrate being A to define an area of a first light-emitting region, wherein the patterned pixel define layer further has a second opening to define a third light-emitting region;

forming a first color layer in the first opening, the first color layer being electrically connected to the first electrode;

forming a first connection layer on the first color layer, a projected area of the first connection layer on the substrate being B to define an area of a second light-emitting region;

forming a second color layer on the first connection layer, the first connection layer being located between the first color layer and the second color layer;

forming a second electrode on the second color layer; wherein when a ratio of B to A is r1, light emitted by the electroluminescent device has a first color temperature; and when the ratio of B to A is r2, the light emitted by the electroluminescent device has a second color temperature, r1 is different from r2, and the first color temperature is different from the second color temperature;

forming a third electrode on the substrate;

forming a third color layer in the second opening, the third color layer being electrically connected to the third electrode;

forming a second connection layer on the third color layer to define a fourth light-emitting region;

forming a fourth color layer on the second connection layer, the second connection layer being located between the third color layer and the fourth color layer; and forming a fourth electrode on the fourth color layer.

11. The manufacturing method of the electroluminescent device according to claim 10, wherein the first color layer is used to emit yellow light, and the second color layer is used to emit blue light, wherein when r1 is larger than r2, the first color temperature is higher than the second color temperature.

12. The manufacturing method of the electroluminescent device according to claim 11, wherein when the ratio of B to A is higher, the light emitted by the electroluminescent device has a higher color temperature.

13. The manufacturing method of the electroluminescent device according to claim 10, wherein the third electrode and the first electrode are formed in a same step, and the second electrode and the fourth electrode are formed in a same step.

14. The manufacturing method of the electroluminescent device according to claim 10, wherein the fourth color layer, the third color layer, and the second color layer comprise a blue electroluminescent material, and the first color layer comprises a yellow electroluminescent material.

15. The manufacturing method of the electroluminescent device according to claim 10, wherein the fourth color layer, the third color layer, and the first color layer comprise a blue electroluminescent material, and the second color layer comprises a yellow electroluminescent material.

16. The manufacturing method of the electroluminescent device according to claim 10, wherein the first color layer comprises a blue electroluminescent material, and the second color layer comprises a yellow electroluminescent material.

17. The manufacturing method of the electroluminescent device according to claim 10, wherein the first color layer comprises a yellow electroluminescent material, and the second color layer comprises a blue electroluminescent material.

* * * * *